United States Patent [19]
Kim

[11] Patent Number: 5,937,306
[45] Date of Patent: Aug. 10, 1999

[54] METHOD OF FABRICATING A CAPACITOR OF A SEMICONDUCTOR DEVICE

[75] Inventor: Jin Gu Kim, Chungcheongbuk-do, Rep. of Korea

[73] Assignee: LG Semicon Co., Ltd., Chungcheongbuk-Do, Rep. of Korea

[21] Appl. No.: 08/991,212

[22] Filed: Dec. 16, 1997

[30] Foreign Application Priority Data

Apr. 25, 1997 [KR] Rep. of Korea ............. 97/15704

[51] Int. Cl.⁶ .................................................. H01L 21/20
[52] U.S. Cl. ............................................. 438/397; 438/254
[58] Field of Search ........................... 438/253, 254, 438/255, 396, 397, 398

[56] References Cited

U.S. PATENT DOCUMENTS

| | | | |
|---|---|---|---|
| 5,639,689 | 6/1997 | Woo | 438/396 |
| 5,789,267 | 8/1998 | Hsia et al. | 438/398 |

*Primary Examiner*—Tuan H. Nguyen
*Attorney, Agent, or Firm*—Morgan, Lewis & Bockius LLP

[57] ABSTRACT

A method of fabricating a capacitor of a semiconductor device is disclosed including the steps of forming a first polysilicon layer and an insulating layer on a semiconductor substrate, implanting ions into the insulating layer to form an ion-implanted layer, patterning the insulating layer including the ion-implanted layer, etching the insulating layer pattern, forming a second polysilicon layer on the insulating layer, removing the insulating layer and the ion-implanted layer, and forming a dielectric layer and a third polysilicon layer on the first and second polysilicon layers.

19 Claims, 3 Drawing Sheets

METHOD OF FABRICATING A CAPACITOR OF A SEMICONDUCTOR DEVICE

This application claims the benefit of Korean Patent Application No. 15704/1997, filed Apr. 25, 1997, which is hereby incorporated by reference.

BACKGROUND OF THE INVENTION

1. Field of the Invention

The present invention relates to a semiconductor device and, more particularly, to a method of fabricating a capacitor of a semiconductor device which increases the effective area of the capacitor in a highly integrated device, increasing the capacitance.

2. Discussion of the Related Art

Generally, capacitors in semiconductor devices are divided into stacked types and trench types. The stacked capacitors are divided into fin structures, cylinder structures, and box structures. The cylinder-structure capacitor has the storage node electrode in the form of cylinder. Memory devices of 64 Mbit and higher generally employ the cylinder-structure capacitor for effectively increasing the capacitance.

A conventional method of fabricating a capacitor of a semiconductor device is explained below with reference to the accompanying drawings. FIGS. 1A, 1B and 1C are cross-sectional views showing the conventional fabrication steps for a capacitor of a semiconductor device.

Referring to FIG. 1A, an interlevel insulating layer 2 is formed on a semiconductor substrate 1 on which cell transistors (not shown) are also formed. The insulating interlayer 2 is then selectively removed, forming a storage node contact hole. A first polysilicon layer 3 is formed on the overall surface of the substrate 1 in order to bury the storage node contact hole. An oxide layer 4 is formed on the first polysilicon layer 3.

Referring to FIG. 1B, the oxide layer 4 is selectively removed through photolithography, and the first polysilicon layer 3 is selectively etched using the patterned oxide layer 4 as a mask. Referring to FIG. 1C, a second polysilicon layer 5 (used for forming a pillar layer of a storage node) is formed on the overall surface of the substrate including the oxide layer 4 and the first polysilicon layer 3. Then, the second polysilicon layer 5 is etched back and remains only on the sides of the oxide layer 4 and the first polysilicon layer 3. The oxide layer 4 is removed through wet etching, completing the storage node of a capacitor.

Thereafter, a dielectric layer (not shown) is formed on the storage node, and a plate electrode (not shown) is formed thereon, completing the capacitor. In the conventional method of fabricating a capacitor, it is possible to form the storage node having curved portions by repeatedly depositing and patterning the oxide layers, thus increasing the capacitance. However, this method of fabrication of capacitors is disadvantageously complicated.

SUMMARY OF THE INVENTION

Accordingly, the present invention is directed to a method of fabricating a capacitor of a semiconductor device that substantially obviates one or more of the problems due to limitations and disadvantages of the conventional art.

An object of the present invention is to provide a method of fabricating a capacitor of a semiconductor device which increases the effective area of the capacitor in a highly integrated semiconductor device to increase the capacitance.

To achieve these an other advantages, and in accordance with the purpose of the present invention, as embodied and broadly described, in a first aspect of the present invention there is provided a method of fabricating a capacitor of a semiconductor device including the steps of forming a first insulating layer on a substrate, forming a first polysilicon layer on the substrate and the first insulating layer, forming a second insulating layer, implanting ions into the second insulating layer to form an ion-implanted layer, patterning the second insulating layer, etching the second insulating layer, forming a second polysilicon layer on the second insulating layer, removing the second insulating layer and the ion-implanted layer, and forming a dielectric layer and a third polysilicon layer on the first and second polysilicon layers.

In a second aspect of the present invention, there is provided a method of forming a capacitor including the steps of forming an insulating layer on a substrate, forming a storage contact hole in the insulating layer, forming a first polysilicon layer covering the insulating layer and the substrate, forming an oxide layer on the first polysilicon layer, forming an ion-implanted layer within the oxide layer, etching the oxide layer while retaining portions of the oxide layer over the storage contact hole, selectively etching the first polysilicon layer using the oxide layer as a mask, forming a second polysilicon layer over the substrate and the portions of the oxide layer, etching the second polysilicon layer, removing portions of the oxide layer between the first polysilicon layer and the second polysilicon layer, forming a dielectric layer over the storage contact hole, and forming a contact over the dielectric layer.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this specification, illustrate embodiments of the invention and together with the description serve to explain the principles of the invention.

In the drawings:

FIGS. 1A, 1B and 1C are cross-sectional views showing a conventional method of fabricating a capacitor of a semiconductor device; and FIGS. 2A–2F are cross-sectional views showing a method of fabricating a capacitor of a semiconductor device according to the present invention.

DETAILED DESCRIPTION OF PREFERRED EMBODIMENTS

Reference will now be made in detail to the preferred embodiment of the present invention, examples of which are illustrated in the accompanying drawings.

FIGS. 2A–2F are cross-sectional views showing a method of fabricating a capacitor of a semiconductor device according to the present invention. The present invention utilizes impurities ion-implanted into an oxide layer used for patterning a storage node. Indented portions are formed in the oxide layer using different etching rates for an ion-implanted region and a non-ion-implanted region in order to increase the effective area of the storage node.

Figure 1A:
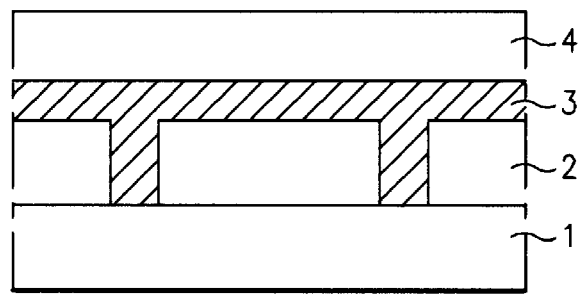
Figure 1B:
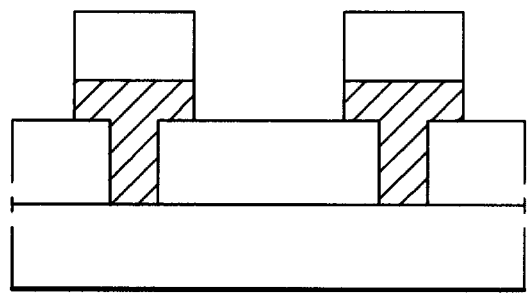
Figure 1C:
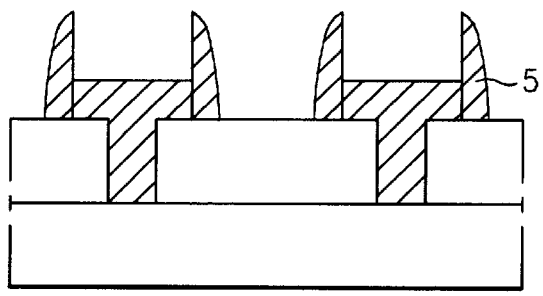
Figure 2A:
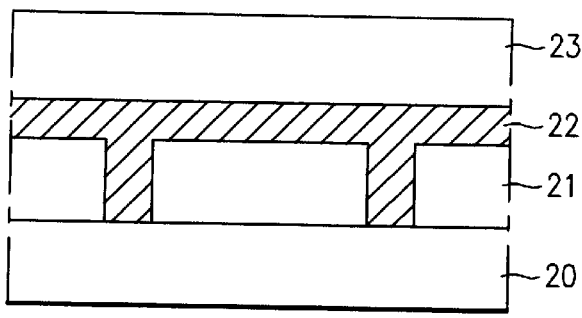

Referring to FIG. 2A, an interlevel insulating layer 21 is formed on a semiconductor substrate 20 on which cell transistors (not shown) are also formed. The insulating interlayer 21 is then selectively removed to expose an impurity diffusion region (not shown) placed on one side of the cell transistors, forming a storage contact hole. A first polysilicon layer 22 is formed to bury the storage node contact hole. An oxide layer 23 is formed on the first polysilicon layer 22 having a thickness of between 3000 Å and 8000 Å.

Figure 2B:
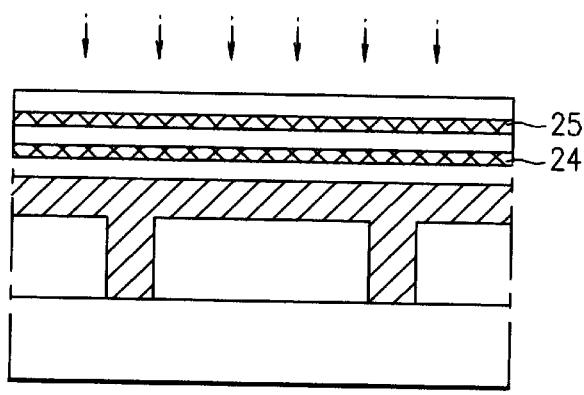

Referring to FIG. 2B, double ion implantation is carried out on the oxide layer 23 by controlling implantation depth using a difference between ion implanting energies. Annealing is then performed, forming first and second ion-implanted layers 24 and 25. By doing so, the oxide layer 23 has ion-implanted layers 24 and 25 and a non-ion-implanted layer. The etching rates of the ion-implanted layers 24 and 25 and the non-ion-implanted layer are different from each other. The ion-implanted layers 24 and 25 and the non-ion-implanted layer may be repeatedly formed to include any number of layers.

Figure 2C:
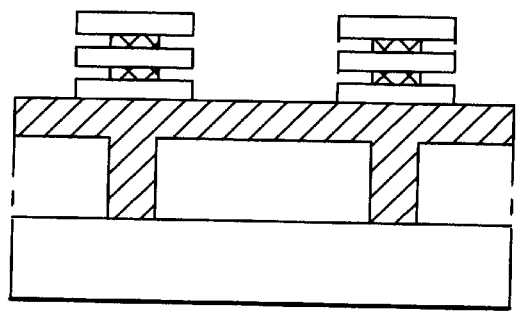

Referring to FIG. 2C, the oxide layer 23 having the ion-implanted layers 24 and 25 and the non-ion-implanted layer is selectively removed using either dry etching or wet etching. Here, the ion-implanted layers 24 and 25 are etched to a greater extent than the non-ion-implanted layer because of the differences in their etching rates. Thus, indented portions are formed in the oxide layer 23. The non-ion-implanted layer may be etched more than the ion-implanted layers 24 and 25 by changing etching conditions.

Figure 2D:
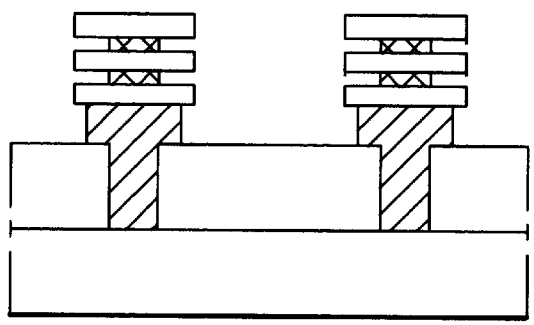
Figure 2E:
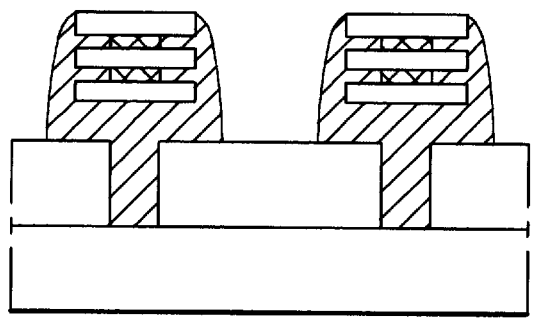

Referring to FIG. 2D, the first polysilicon layer 22 is selectively etched using the patterned oxide layer 23 (the non-ion-implanted layer) as a mask. Referring to FIG. 2E, a second polysilicon layer 27 is formed on the overall surface of the substrate including the patterned oxide layer 23 and the first polysilicon layer 22. The second polysilicon layer 27 is also formed on indented portions of the oxide layer 23. Thereafter, the second polysilicon layer 27 is etched back to expose a top surface of the non-ion-implanted oxide layer 23. By doing so, the second polysilicon layer 27 remains on the sides of the oxide layer 23 and the first polysilicon layer 22.

Figure 2F:
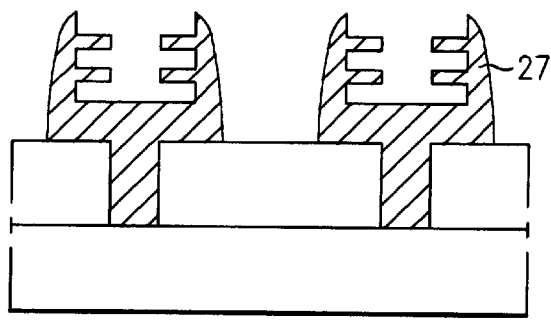

Referring to FIG. 2F, the oxide layer 23 remaining between the first and second polysilicon layers 22 and 27 is removed through wet etching, thus forming a storage node. A dielectric layer (not shown) is formed on the storage node, and a plate electrode (not shown) is formed thereon, completing the capacitor. As a result, a storage node having indented portions is formed in a small area in a manner to increase the effective area of the capacitor.

The present invention allows increasing the capacitance in a given area. This is useful in manufacturing highly integrated memory devices. Furthermore, a large-capacitance capacitor can be formed using ion implantation to change the etching rate, rather than the complicated conventional process where oxide layers are repeatedly deposited and patterned. Accordingly, production costs can be reduced.

It will be apparent to those skilled in the art that various modifications and variations can be made in the method of fabricating a capacitor of a semiconductor device of the present invention without departing from the spirit or scope of the invention. Thus, it is intended that the present invention cover the modifications and variations of this invention provided they come within the scope of the appended claims and their equivalents.

What is claimed is:

1. A method of fabricating a capacitor of a semiconductor device comprising the steps of:

forming a first insulating layer on a substrate, the first insulating layer having a contact hole;

forming a first polysilicon layer on the substrate and the first insulating layer;

forming a second insulating layer;

implanting ions into a portion of the second insulating layer to form an ion-implanted layer within the second insulating layer;

selectively etching the second insulating layer;

forming a second polysilicon layer at sides of remaining portions of the second insulating layer;

removing the second insulating layer and the ion-implanted layer; and forming a dielectric layer and a third polysilicon layer on the first and second polysilicon layers.

2. The method according to claim 1, wherein the step of forming a second insulating layer comprises forming the second insulating layer having a thickness of between 3000 Å and 8000 Å.

3. The method according to claim 1, wherein the step of implanting ions comprises forming a plurality of ion-implanted layers within the second insulating layer by implanting ions having different energies.

4. The method according to claim 3, further comprising the step of annealing the second insulating layer, after the step of forming a plurality of ion-implanted layers within the second insulating layer by implanting ions having different energies.

5. The method according to claim 4, wherein the ion-implanted layer is etched to a greater extent than a non-ion-implanted layer of the second insulating layer during the step of selectively etching the second insulating layer.

6. The method according to claim 1, wherein the step of selectively etching the second insulating layer uses dry etching.

7. The method according to claim 1, wherein the step of selectively etching the second insulating layer uses wet etching.

8. The method according to claim 1, wherein the ion-implanted layer of the second insulating layer is etched to a greater extent than a non-ion-implanted layer of the second insulating layer during the step of selectively etching the second insulating layer.

9. The method according to claim 1, further comprising the step of etching the first polysilicon layer by using a non-ion-implanted layer of the selectively etched second insulating layer as a mask.

10. The method according to claim 1, wherein step of forming the second insulating layer comprises forming an oxide layer.

11. The method according to claim 1, wherein the step of forming the ion-implanted layer comprises forming a plurality of ion-implanted layers within the second insulating layer.

12. A method of forming a capacitor comprising the steps of:

forming an insulating layer on a substrate;

forming a storage contact hole in the insulating layer;

forming a first polysilicon layer covering the insulating layer and the substrate;

forming an oxide layer on the first polysilicon layer;

forming an ion-implanted layer within the oxide layer;

etching the oxide layer while retaining portions of the oxide layer over the storage contact hole;

selectively etching the first polysilicon layer using the oxide layer as a mask;

forming a second polysilicon layer over the substrate and the portions of the oxide layer;

selectively etching the second polysilicon layer;

removing portions of the oxide layer between the first polysilicon layer and the second polysilicon layer;

forming a dielectric layer over the storage contact hole; and forming a contact over the dielectric layer.

13. The method according to claim 12, further comprising the step of annealing the oxide layer after the step of forming the ion-implanted layer within the oxide layer.

14. The method according to claim 13, wherein the step of forming the ion-implanted layer comprises forming a plurality of ion-implanted layers within the oxide layer.

15. The method according to claim 12, wherein the step of forming the ion-implanted layer comprises forming a first ion-implanted region within the oxide layer; and forming a second ion-implanted region within the oxide layer and at a different depth from the first ion-implanted layer.

16. The method according to claim 12, wherein the step of forming the ion-implanted layer comprises forming a plurality of ion-implanted layers within the oxide layer.

17. The method according to claim 12, wherein the ion-implanted layer is etched to a greater extent than non-ion-implanted portions of the oxide layer during the step of etching the oxide layer.

18. The method according to claim 12, wherein the step of etching of the oxide layer while retaining portions of the oxide layer over the storage contact hole uses wet etching.

19. The method according to claim 12, wherein the step of etching the oxide layer while retaining portions of the oxide layer over the storage contact hole uses dry etching.

* * * * *